United States Patent
Nehoran et al.

(10) Patent No.: US 6,717,483 B2
(45) Date of Patent: Apr. 6, 2004

(54) LOW COST VOLTAGE CONTROLLED CRYSTAL OSCILLATOR (VCXO)

(75) Inventors: Yoed I. Nehoran, Fremont, CA (US); Yuanping Zhao, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 16 days.

(21) Appl. No.: 10/113,404

(22) Filed: Apr. 1, 2002

(65) Prior Publication Data

US 2003/0184396 A1 Oct. 2, 2003

(51) Int. Cl.[7] .............................. H03B 5/30; H03B 5/36
(52) U.S. Cl. .................. 331/158; 331/34; 331/116 R; 331/175; 331/177 R; 331/185
(58) Field of Search .................. 331/34, 116 R, 331/116 FE, 158, 175, 177 R, 185, 186

(56) References Cited

U.S. PATENT DOCUMENTS

| | | | |
|---|---|---|---|
| 4,387,349 A | * | 6/1983 | Rapp .................... 331/116 FE |
| 6,094,105 A | | 7/2000 | Williamson ........... 331/116 FE |
| 6,181,217 B1 | | 1/2001 | White ........................ 331/158 |

* cited by examiner

*Primary Examiner*—David Mis
(74) *Attorney, Agent, or Firm*—Christopher P. Maiorana, P.C.

(57) ABSTRACT

A circuit generally comprising a tank circuit and an inverter circuit. The tank circuit may be configured to generate a first signal having a frequency of oscillation in response to a second signal. The inverter circuit may be configured to (i) generate the second signal in response to inverting the first signal and (ii) adjust a delay in generating the second signal in response to an input signal to change the frequency of oscillation.

20 Claims, 13 Drawing Sheets

VCXO CONTROL GAIN OR SENSITIVITY

| VCXO TYPE | RANGE LOW | RANGE HIGH | VOLTAGE LOW | VOLTAGE HIGH | CONTROL GAIN | CONTROL GAIN | +/- 150 PPM VOLTAGE | CONTROL GAIN RANK | DATA SOURCE |
|---|---|---|---|---|---|---|---|---|---|
| UNITS | PPM | PPM | VOLT | VOLT | PPM/VOLT | PPM/100mV | VOLTAGE | GAIN RANK | US PATENT # |
| MK3727 MIN. | -153.3 | 143.3 | 0.3 | 3.1 | 105.929 | 10.593 | 2.832 | 8 | |
| MK3727 MAX. | -182.7 | 150.6 | 0.3 | 3.1 | 119.036 | 11.904 | 2.520 | 4 | |
| MK3727 AVE. | -168 | 146.95 | 0.3 | 3.1 | 112.482 | 11.248 | 2.667 | 6 | |
| 74ALS00 (A) | 11.7 | 200.7 | 3.2 | 6.1 | 65.172 | 6.517 | 4.603 | 13 | |
| 74ALS00 (B) | -93.1 | 35.8 | 3.2 | 6.1 | 44.448 | 4.445 | 6.749 | 18 | |
| 74HC86 (A) | -107.8 | 100.4 | 2.2 | 6.0 | 54.789 | 5.479 | 5.476 | 15 | |
| 74HC86 (B) | -107.8 | 100.4 | 2.2 | 5.5 | 63.091 | 6.309 | 4.755 | 14 | |
| 74HC86 (C) | -91.6 | 29.8 | 2.0 | 4.4 | 50.583 | 5.058 | 5.931 | 17 | |
| 74HC86 (D) | -129.8 | 20.2 | 2.0 | 4.5 | 60.000 | 6.000 | 5.000 | 12 | |
| 74HC04 (A) | -111.4 | 104.8 | 2.0 | 6.0 | 54.050 | 5.405 | 5.550 | 16 | |
| 74HC04 (B) | -160.5 | 53.6 | 2.0 | 4.9 | 73.828 | 7.383 | 4.064 | 11 | |
| 74HC04 (C) | -111.6 | 156 | 1.1 | 4.7 | 99.111 | 9.911 | 3.027 | 10 | |
| DEMOD (1) | -219.8 | 46.9 | 1.1 | 2.8 | 156.882 | 15.688 | 1.912 | 1 | |
| DEMOD (2) | -124.9 | 131 | 1.3 | 3.8 | 102.360 | 10.236 | 2.931 | 9 | |
| DEMOD (3) | -131.1 | 137.3 | 1.2 | 3.7 | 107.360 | 10.736 | 2.794 | 7 | |
| DEMOD (4) | -132.5 | 81.9 | 1.2 | 3.0 | 119.111 | 11.911 | 2.519 | 5 | |
| DEMOD (5) | -128.9 | 105.3 | 1.2 | 3.1 | 123.263 | 12.326 | 2.434 | 2 | |
| DEMOD (6) | -135.2 | 86.5 | 1.2 | 3.0 | 123.167 | 12.317 | 2.436 | 3 | |
| DISCRETE OLD | -190 | 220 | 1.0 | 22.0 | 19.524 | 1.952 | 15.366 | 20 | 6,181,217 |
| DISCRETE NEW | -280 | 390 | 1.0 | 22.0 | 31.905 | 3.190 | 9.403 | 19 | 6,181,217 |

FIG. 10

VCXO CONTROL LINEARITY STUDY

| VCXO TYPE | RANGE LOW | RANGE HIGH | VOLTAGE LOW | VOLTAGE HIGH | MIDDLE RANGE | MIDDLE VOLTAGE | LINEAR MIDDLE | LINEAR MIDDLE VOLTAGE | LINEARITY | ABSOLUTE RANK | COMPENSATED LINEARITY (%) | COMPENSATED RANK |
|---|---|---|---|---|---|---|---|---|---|---|---|---|
| UNITS | PPM | PPM | VOLT | VOLT | PPM | VOLT | PPM | VOLTAGE | % | | | |
| MK3727 MIN. | -153.3 | 143.3 | 0.3 | 3.1 | -2.1 | 1.7 | -5.000 | 1.700 | 1.955 | 3 | -19.107 | 8 |
| MK3727 MAX. | -182.7 | 150.6 | 0.3 | 3.1 | -15.3 | 1.7 | -16.050 | 1.700 | 0.450 | 1 | -20.612 | 11 |
| MK3727 AVE. | -168 | 146.95 | 0.3 | 3.1 | -8.7 | 1.7 | -10.525 | 1.700 | 1.159 | 2 | -19.903 | 9 |
| 74ALS00 (A) | 11.7 | 200.7 | 3.2 | 6.1 | 156.0 | 4.7 | 106.200 | 4.650 | 52.698 | 17 | 31.636 | 16 |
| 74ALS00 (B) | -93.1 | 35.8 | 3.2 | 6.1 | -15.9 | 4.1 | -28.650 | 4.650 | 19.783 | 8 | -1.279 | 2 |
| 74HC86 (A) | -107.8 | 100.4 | 2.2 | 6.0 | 60.7 | 4.1 | -3.700 | 4.100 | 61.864 | 19 | 40.802 | 19 |
| 74HC86 (B) | -107.8 | 100.4 | 2.2 | 5.5 | 41.2 | 3.9 | -3.700 | 3.850 | 43.132 | 16 | 22.070 | 13 |
| 74HC86 (C) | -91.6 | 29.8 | 2.0 | 4.4 | -4.8 | 3.2 | -30.900 | 3.200 | 42.998 | 15 | 21.936 | 12 |
| 74HC86 (D) | -129.8 | 20.2 | 2.0 | 4.5 | -5.0 | 3.8 | -54.800 | 3.250 | 66.400 | 20 | 45.338 | 20 |
| 74HC04 (A) | -111.4 | 104.8 | 2.0 | 6.0 | 32.6 | 4.0 | -3.300 | 4.000 | 33.210 | 13 | 12.148 | 7 |
| 74HC04 (B) | -160.5 | 53.6 | 2.0 | 4.9 | -29.0 | 3.5 | -53.450 | 3.450 | 22.840 | 10 | 1.778 | 3 |
| 74HC04 (C) | -111.6 | 156 | 2.0 | 4.7 | 51.9 | 3.4 | 22.200 | 3.350 | 22.197 | 9 | 1.135 | 1 |
| DEMOD (1) | -219.8 | 46.9 | 1.1 | 2.8 | -98.8 | 2.0 | -86.450 | 1.950 | -9.261 | 5 | -30.323 | 15 |
| DEMOD (2) | -124.9 | 131 | 1.3 | 3.8 | -12.1 | 2.6 | 3.050 | 2.550 | -11.841 | 6 | -32.908 | 17 |
| DEMOD (3) | -131.1 | 137.3 | 1.2 | 3.7 | -5.5 | 2.5 | 3.100 | 2.450 | -6.408 | 4 | -27.470 | 14 |
| DEMOD (4) | -132.5 | 81.9 | 1.2 | 3.0 | 0.3 | 2.1 | -25.300 | 2.100 | 23.881 | 11 | 2.819 | 5 |
| DEMOD (5) | -128.9 | 105.3 | 1.2 | 3.1 | 17.0 | 2.2 | -11.800 | 2.150 | 24.594 | 12 | 3.532 | 6 |
| DEMOD (6) | -135.2 | 86.5 | 1.2 | 3.0 | -3.5 | 2.1 | -24.350 | 2.100 | 18.809 | 7 | -2.253 | 4 |
| DISCRETE OLD | -190 | 220 | 1.0 | 22.0 | 128.0 | 11.5 | 15.000 | 11.500 | 55.122 | 18 | 34.060 | 18 |
| DISCRETE NEW | -280 | 390 | 1.0 | 22.0 | 190.0 | 11.5 | 55.000 | 11.500 | 40.299 | 14 | 19.237 | 9 |
| DAC OUTPUT A | 0.3147 | 3.0527 | 1 | 15 | 1.3953 | 8.0 | 1.684 | 8.0 | -21.062 | | 0.000 | |
| DAC OUTPUT B | 0.281 | 3.005 | 1 | 15 | 1.162 | 8.0 | 1.643 | 8.0 | -35.316 | | -14.254 | |
| DAC OUTPUT C | 0.208 | 2.953 | 1 | 15 | 0.935 | 8.0 | 1.581 | 8.0 | -47.031 | | -25.969 | |

LOW COST VOLTAGE CONTROLLED CRYSTAL OSCILLATOR (VCXO)

FIELD OF THE INVENTION

The present invention relates to a method and/or architecture for voltage controlled crystal oscillators generally and, more particularly, to controlling voltage controlled crystal oscillators by adjusting an inverting delay.

BACKGROUND OF THE INVENTION

Voltage Controlled Crystal Oscillators (VCXO) are an important circuit in Set-Top Boxes (STB) to track digital television broadcaster's master frequency from program to program. In an STB, the VCXO functions as an executor within a Program Clock Recovering (PCR) Loop to trim a local system clock frequency up to +/−100 ppm.

The VCXO has many kinds of physical formats each with different costs. A metal-can VCXO has a best performance but a cost that is not acceptable for a consumer product like an STB. Lower cost clock synthesizers, such as an MK3727 available from Integrated Circuit Systems, San Jose, Calif., that work with a pullable crystal are available at a more reasonable price. Conventional discrete VCXOs may also be available, but both bill of materials (BOM) and total costs are commonly undesirable. A conventional discrete VCXO format having a good performance and modest BOM was disclosed in U.S. Pat. No. 6,181,217 by White. However, a lower cost VCXO is still desired to reduce a cost of the STB.

SUMMARY OF THE INVENTION

The present invention concerns a circuit generally comprising a tank circuit and an inverter circuit. The tank circuit may be configured to generate a first signal having a frequency of oscillation in response to a second signal. The inverter circuit may be configured to (i) generate the second signal in response to inverting the first signal and (ii) adjust a delay in generating the second signal in response to an input signal to change the frequency of oscillation.

The objects, features and advantages of the present invention include providing a method and/or architecture for voltage controlled crystal oscillation that may provide (i) a simple design structure, (ii) easy integration into an integrated circuit, (iii) a small silicon area consumption, (iv) a low production cost, (v) a high reliability, (vi) easy manufacturing, (vii) compatibility with digital fabrication processes, (viii) precision control by an analog input, (ix) a low jitter output, (x) good performance and/or (xi) a high performance to cost ratio.

BRIEF DESCRIPTION OF THE DRAWINGS

These and other objects, features and advantages of the present invention will be apparent from the following detailed description and the appended claims and drawings in which:

FIG. 10 is a table of control gain data;

FIG. 11 is a table of data from a linearity study;

DETAILED DESCRIPTION OF THE PREFERRED EMBODIMENTS

Figure 1:
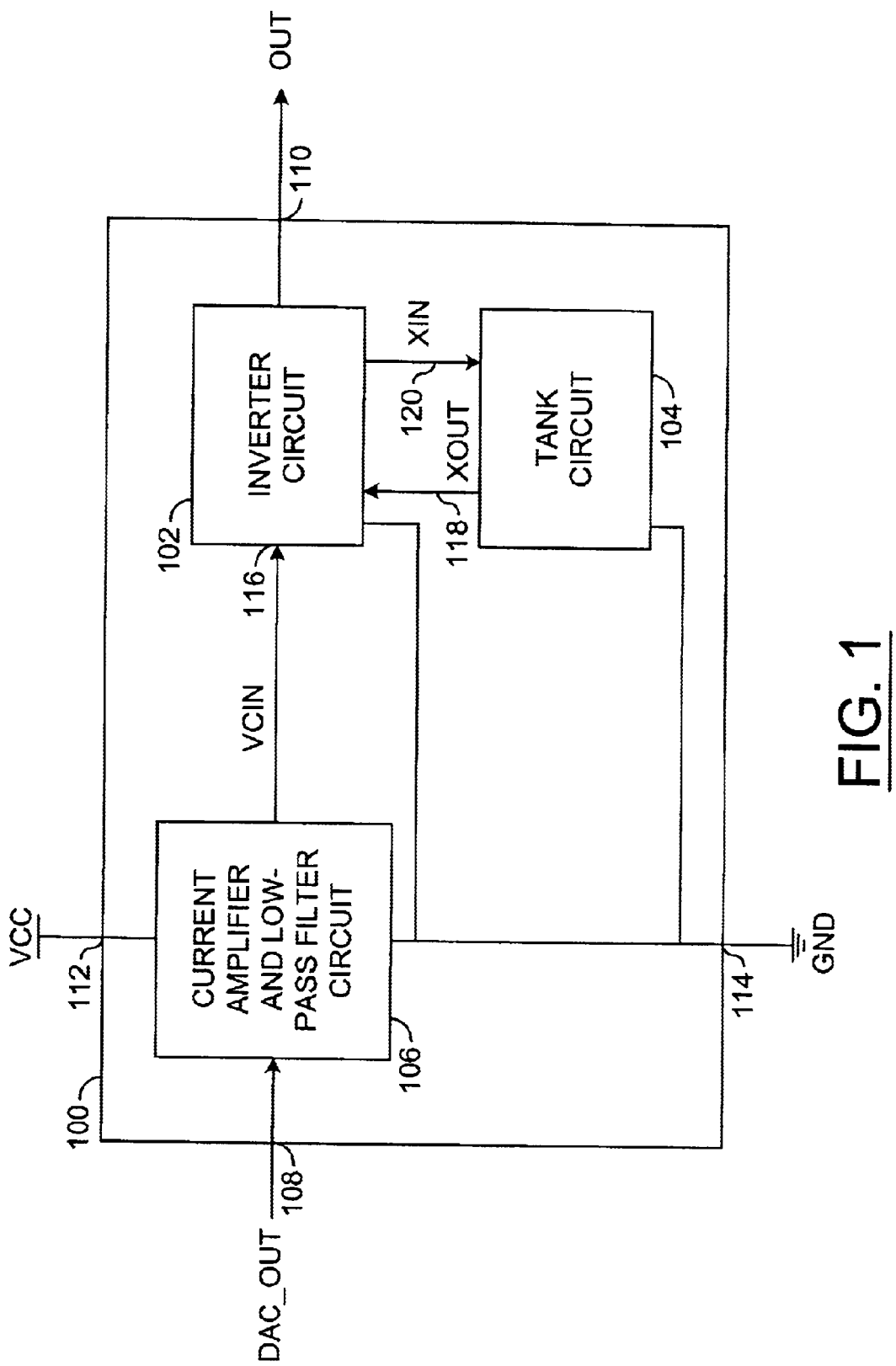
FIG. 1 is a block diagram of a preferred embodiment of the present invention.

Referring to FIG. 1, a block diagram of a circuit 100 is shown in accordance with a preferred embodiment of the present invention. The circuit 100 generally comprises a circuit 102, a circuit 104, and an optional circuit 106. An input 108 may be provided in the circuit 100 to receive a signal (e.g., DAC_OUT). An output 110 may be provided in the circuit 100 to present a signal (e.g., OUT). A power signal (e.g., VCC) from a power supply (not shown) may be coupled to an interface 112 of the circuit 100. A ground or return signal (e.g., GND) of the power supply may be coupled to an interface 114 of the circuit 100.

The circuit 100 may be implemented as a voltage controlled crystal oscillator (VCXO) circuit. The signal DAC_OUT may be implemented as a system control digital-to-analog converter (DAC) output voltage signal. In particular, the signal DAC_OUT may be a type of control signal intended to control the frequency of a system clock. The signal OUT may be implemented as the system clock signal having a frequency of oscillation.

The VCXO circuit 100 may generate and present the signal OUT in response to the signal DAC_OUT. A transfer function of the VCXO circuit 100 may increase or decrease the frequency of the signal OUT as a voltage of the signal DAC_OUT increases. In a preferred embodiment, a positive transfer function may increase the frequency of the signal OUT as the signal DAC_OUT increases. In one embodiment, a negative transfer function may decrease the frequency of the signal OUT as the signal DAC_OUT increases.

The circuit 102 may be implemented as an inverting circuit. The inverting circuit 102 may have an interface 116 to receive a signal (e.g., VCIN) from the circuit 106. The inverting circuit 102 may have another interface 118 to receive another signal (e.g., XOUT) from the circuit 104. A signal (e.g., XIN) may be generated by the inverting circuit 102 as a function of the signal VCIN and the signal XOUT. An interface 120 may be provided in the circuit 102 to present the signal XIN to the circuit 104. The signal OUT may also be generated by the inverter circuit 102 as a function of the signal VCIN and the signal XOUT. In one embodiment, the signal OUT and the signal XIN may be the same signal.

The circuit 104 may be implemented as a tank circuit having a resonant frequency. In particular, the tank circuit 104 may naturally resonate at a central frequency. The tank circuit 104 may receive the signal XIN through the interface 120 to stimulate, maintain and adjust or pull a frequency of oscillation. The tank circuit 104 may generate and present the signal XOUT through the interface 118 to the inverting circuit 102. The signal XOUT may have the frequency of oscillation.

The circuit 106 may be implemented as an optional current amplifier and low-pass filter circuit. The current amplifier/low-pass filter circuit 106 may provide for current amplification of the signal DAC_OUT to generate the signal VCIN. The current amplifier/low-pass filter circuit 106 may receive electrical power required for amplification through a power supply voltage defined by the power signal VCC and the ground signal GND.

The VCXO circuit 100 is generally based on a characteristic of logic gates where a raising or falling time, as well as a delay time, of a logic gate may vary with a power supply voltage. Since the logic gates may operate over a certain power supply range, a variable delay through the logic gate may be controlled by changing the power supply voltage powering the logic gate. A variable delay logic gate incorporated into an oscillator may therefore provide for changes in an oscillating frequency due to changes in the power supply voltage. A central frequency of the oscillator may be determined by incorporating a crystal into the oscillator. Furthermore, the variable delay gate may have some control ability to trim or pull the frequency of oscillation away from the central frequency. If the crystal is pullable (e.g., can be varied in frequency), the change of logic gate delay time may pull the frequency of oscillation to a new point along a resonant curve for the crystal.

Figure 2:
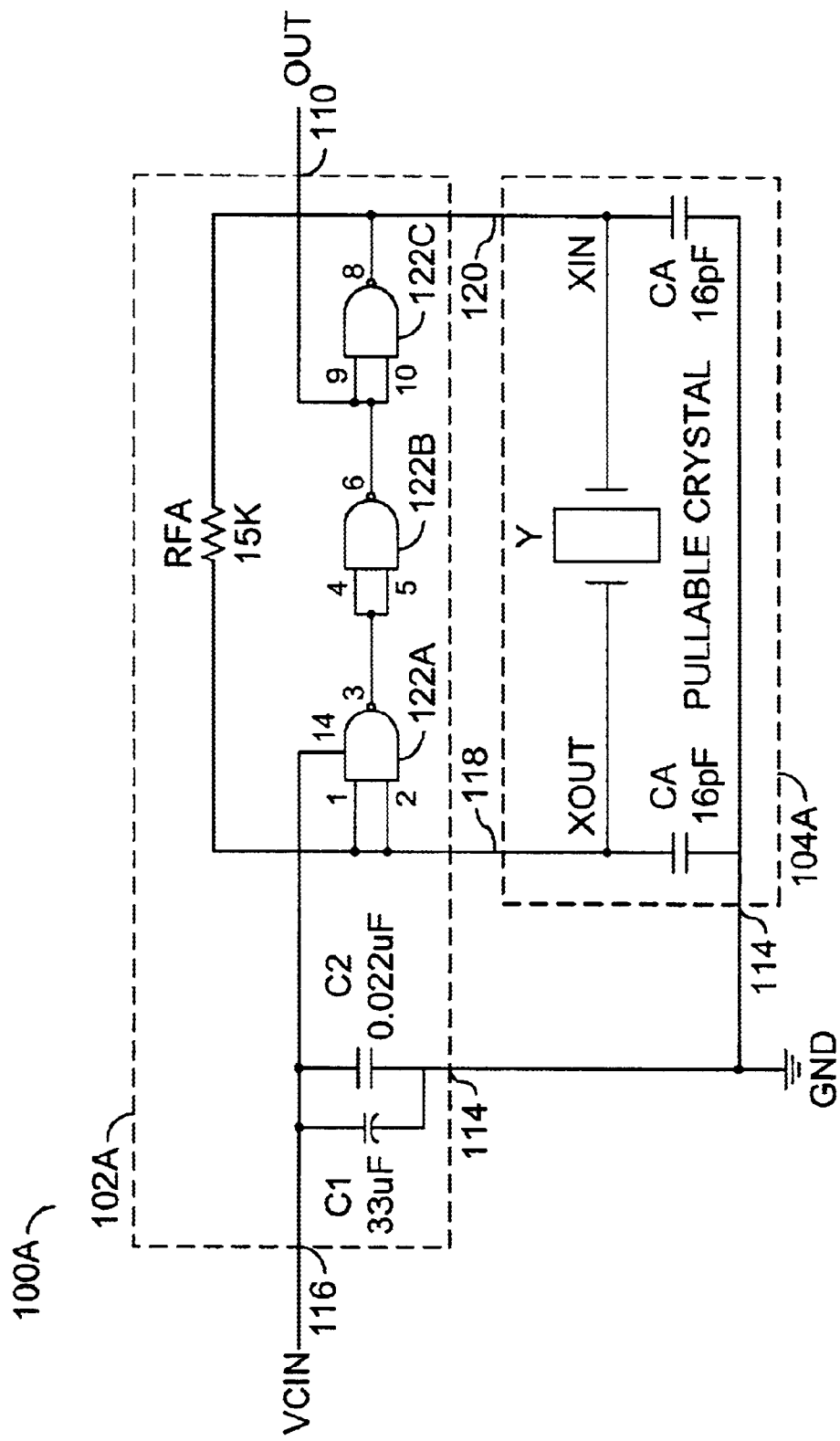
FIG. 2 is a schematic of a first example embodiment.

Referring to FIG. 2, a schematic of a first example implementation of a VCXO circuit 100A is shown. The VCXO circuit 100A may comprise an inverter circuit 102A and a tank circuit 104A. The inverter circuit 102A generally comprises multiple NAND gates 122A-C. The NAND gates 122A-C may be implemented with a 74ALS00 TTL logic device. The NAND gates 122A-C may be connected in series, output-to-input, as shown to implement an inverting function.

Each input (e.g., pins 1 and 2) of the first NAND gate 122A may receive the input signal XOUT. An output (e.g., pin 8) of the third NAND gate 122C may present the signal XIN. An output (e.g., pin 6) of the second NAND gate 122B may present the signal OUT. The input 116 (e.g., VCC pin 14 of the 74ALS00 logic device) may receive the input signal VCIN as the power supply voltage. As a result, the 74ALS00 logic device may be electrically powered by the input signal VCIN.

A feedback resistor RFA may be connected from the output of the third NAND gate 122C back to the inputs of the first NAND gate 122A. A value of the feedback resistor RFA may be 15 kilohms (kΩ). A pair of capacitors C1 and C2 may be connected between the interface 116 and the interface 114 (e.g., the signal GND) to filter the signal VCIN. A value of the capacitor C1 may be 33 microfarads (μF). A value of the capacitor C2 may be 0.022 μF. Other values of the resistor RFA and the capacitors C1 and C2 may be implemented to meet the design criteria of a particular application.

The tank circuit 104B generally comprises a crystal Y and a pair of capacitors CA (two places). The crystal Y may be a 13.500 megahertz (MHz) pullable crystal, manufactured by SaRonix, Menlo Park, Calif., and packaged in a conventional HU-49 metal case. The crystal Y may also be a 27 MHz crystal pullable crystal. A 27 MHz pullable crystal is generally available from Precision Devices, Inc., Middleton, Wis. Values of both tank capacitors CA may be 16 picofarad (pF). Other values of the capacitors CA and the central frequency of the crystal Y may be implemented to meet the design criteria of a particular application.

Figure 3:
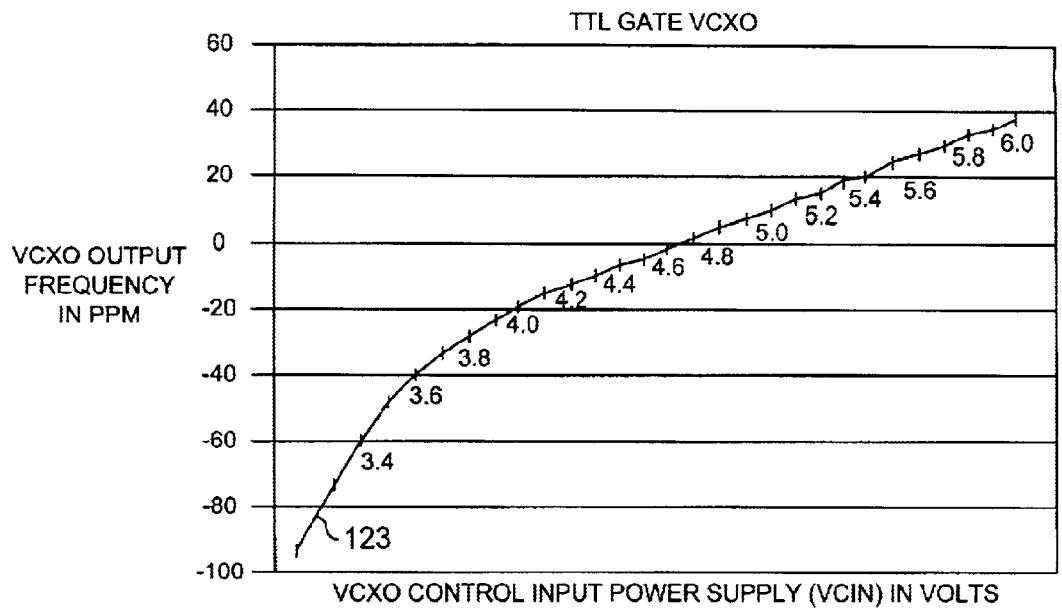
FIG. 3 is a graph of a frequency characteristic of the first embodiment.

Referring to FIG. 3, a graph of an output frequency characteristic of the VCXO circuit 100A is shown. The VCXO circuit 100A generally has a voltage control and frequency pulling ability as shown by a curve 123. A frequency pulling range generally extends from −100 parts per million (ppm) to +40 ppm about the central frequency (e.g., zero ppm). At low voltages at the input signal VCIN (e.g., <4.0 volts), the frequency of the signal OUT is generally nonlinear with respect to the input signal VCIN. As the input signal VCIN increases in voltage, a response of the frequency becomes more linear. Overall, a control gain of the VCXO circuit 102A may decrease as the input signal VCIN increases. In other words, a rate of change for the frequency of the signal OUT may decrease as a voltage of the input signal VCIN increases.

Figure 4:
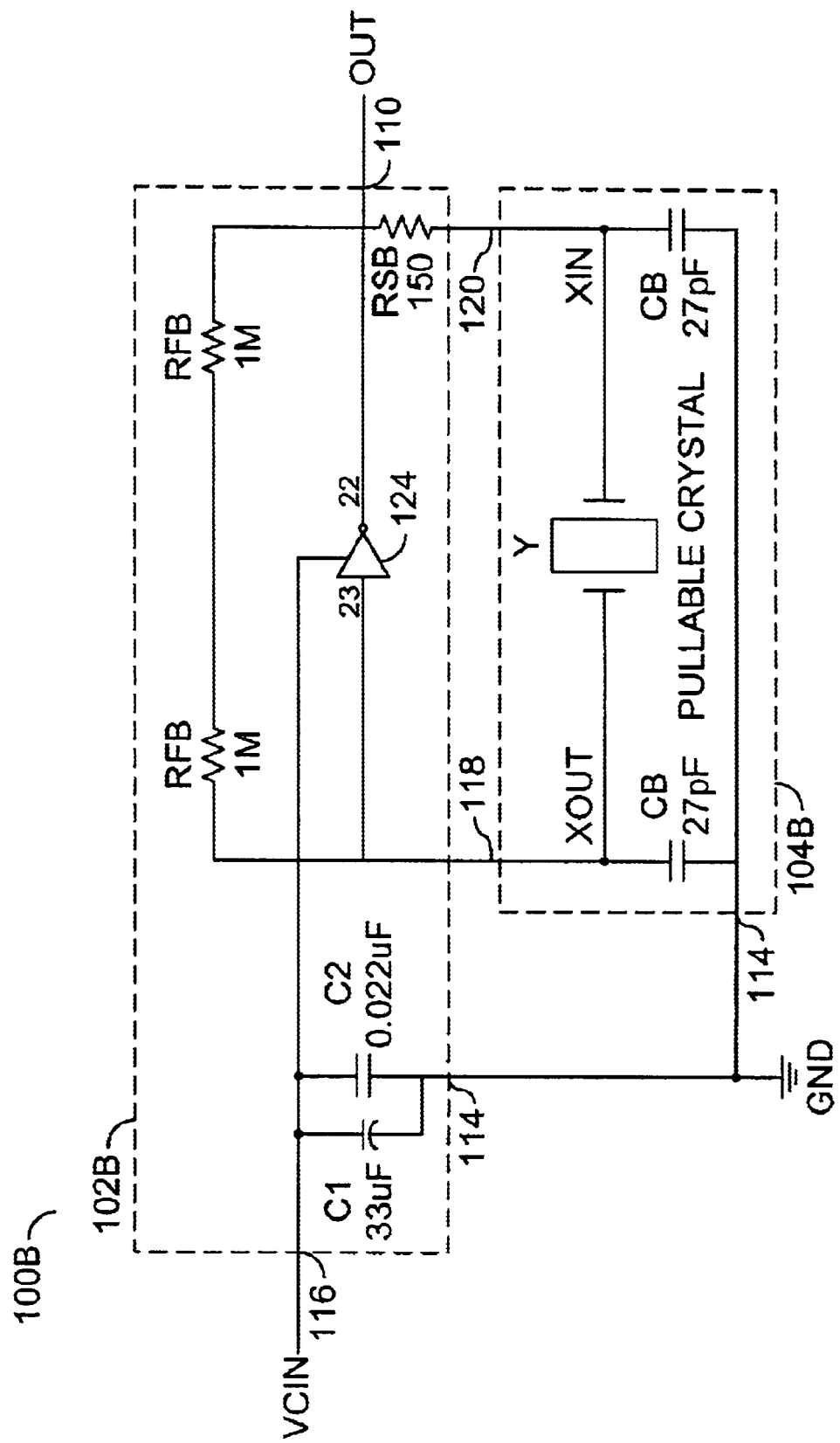
FIG. 4 is a schematic of a second example embodiment.

Referring to FIG. 4, a schematic of a second example implementation of a VCXO circuit 100B is shown. The VCXO circuit 100B may comprise an inverter circuit 102B and a tank circuit 104B. The inverter circuit 102B generally comprises a CMOS inverter 124. The CMOS inverter 124 may be implemented as part of a larger device, such as a demodulator device. Other devices having an inverter may be implemented to meet the design criteria of a particular application.

The CMOS inverter 124 generally provides for the interfaces 118 and 116 to a tank circuit 104B between a pin 22 and a pin 23 respectively. The signal XOUT may be received through the interface 118 at an input of the CMOS inverter 124. The signal OUT may be presented at the output 120 by the CMOS inverter 124. The input signal VCIN may provide electrical power through the interface 116 to operate the CMOS inverter 124.

Two feedback resistors RFB (two places) may be provided in series between the input and the output of the CMOS inverter 124. Each of the feedback resistors RFB may have a value of one megohm (MΩ). The two capacitors C1 and C2 may be provided between the interface 116 and the interface 114 to filter the input signal VCIN. A serial resistor RSB between an output of the CMOS inverter 124 and the interface 120 may be used to match an impedance between oscillator output and the crystal Y. The series resistor RSB may have a value of 150 Ω. Other values of the series resistor RSB may be implemented to meet the design criteria of a particular application.

The tank circuit 104B may have the same general configuration as the tank circuit 104A. The crystal Y within the tank circuit 104B may be the same crystal as in the tank circuit 104A. Both tank capacitors CB may have a value of 27 pF in the tank circuit 104B.

Figure 5:
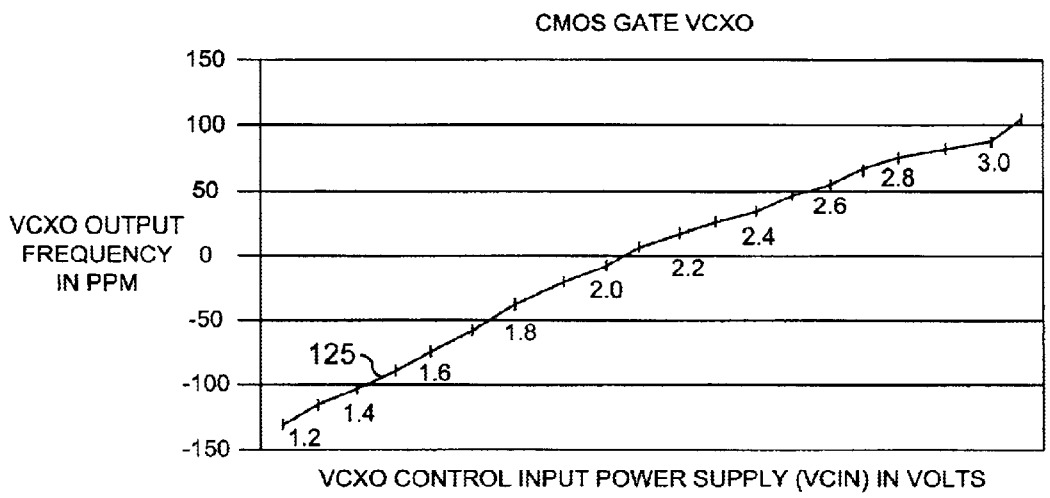
FIG. 5 is a graph of a frequency characteristic of the second embodiment.

Referring to FIG. 5, a graph of an output frequency characteristic of the VCXO circuit 100B is shown. The VCXO circuit 100B generally has a good voltage control and frequency pulling ability as shown by a curve 125. A frequency pulling range of the VCXO circuit 100B may extend from −130 ppm to +100 ppm.

Figure 6:
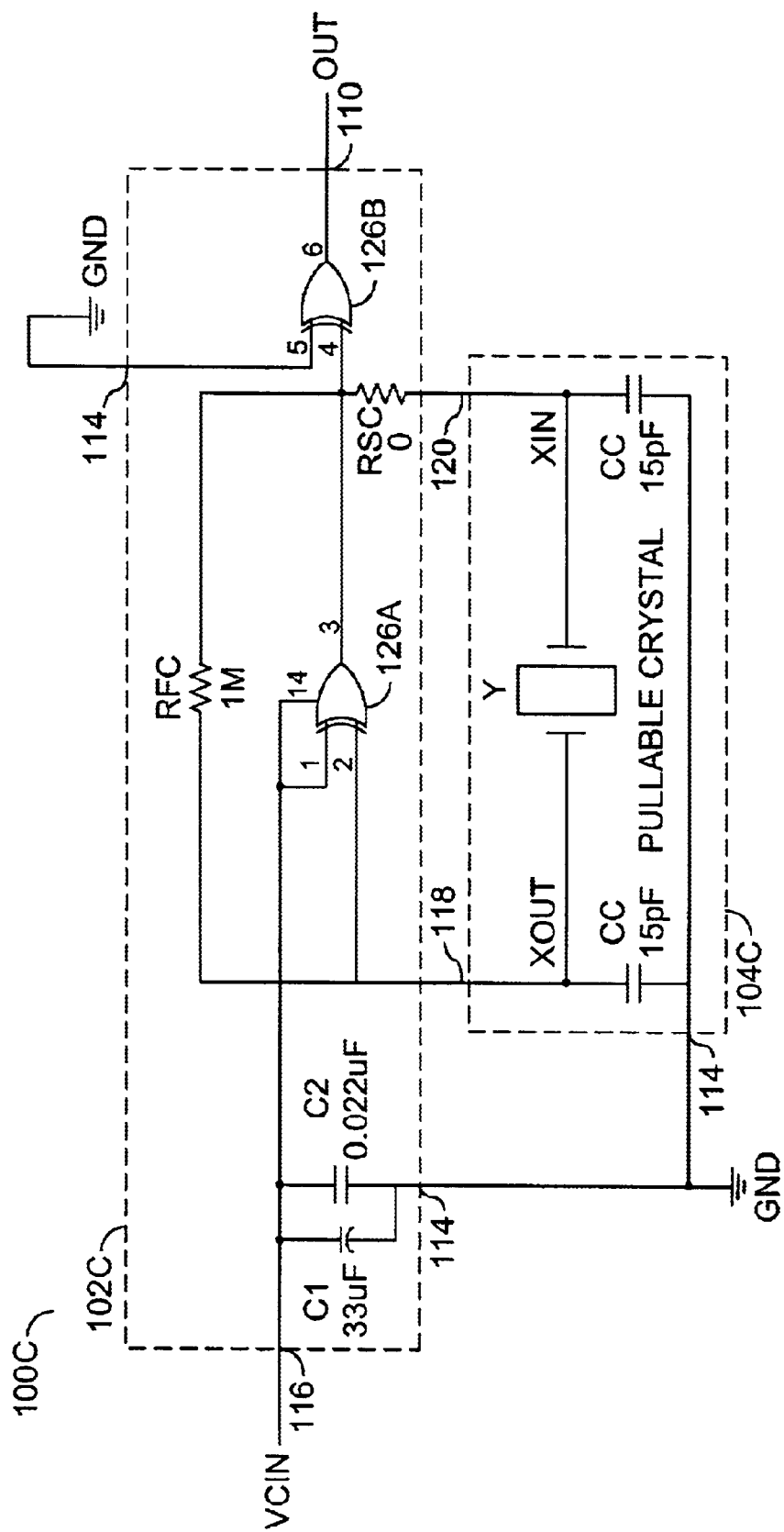
FIG. 6 is a schematic of a third example embodiment.

Referring to FIG. 6, a schematic of a third example implementation of a VCXO circuit 100C is shown. The VCXO circuit 100C may comprise an inverter circuit 102C and a tank circuit 104C.

The inverter circuit 102C may comprise two exclusive OR (XOR) gates 126A-B. The XOR gates 126 may be implemented with a 74HC86 logic device. An inverting function may be achieved by linking an input of the first XOR gate 126A to the signal VCIN. Buffering of the signal OUT may be provided by the second XOR gate 126B.

A feedback resistors RFC may be provided between an input and an output of the first XOR gate 126A. The feedback resistor RFC may have a value of one megohm (MΩ). The two capacitors C1 and C2 may be provided between the interface 116 and the interface 114 to filter the input signal VCIN. A series resistor RSC may be connected between an output of the first XOR gate 126A and the interface 120. The series resistor RSC may have a value of zero ohms in one embodiment.

The tank circuit 104C may have the same general configuration as the tank circuit 104A. The crystal Y within the tank circuit 104C may be the same crystal as in the tank circuit 104A. Both tank capacitors CC may have a value of 15 pF in the tank circuit 104C.

Figure 7:
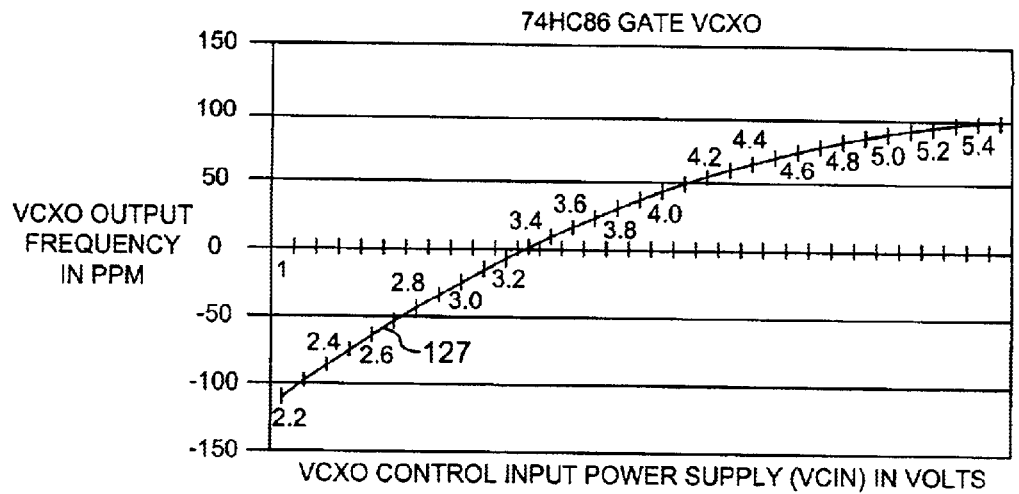
FIG. 7 is a graph of a frequency characteristic of the third embodiment.

Referring to FIG. 7, a graph of an output frequency characteristic of the VCXO circuit 100B is shown. A frequency pulling range of the VCXO circuit 100C is generally from −100 ppm to +100 ppm as shown by a curve 127. A transfer function of the VCXO circuit 100C is generally nonlinear. A control gain of the VCXO circuit 100C may decrease while the input signal VCIN increases.

Figure 8:
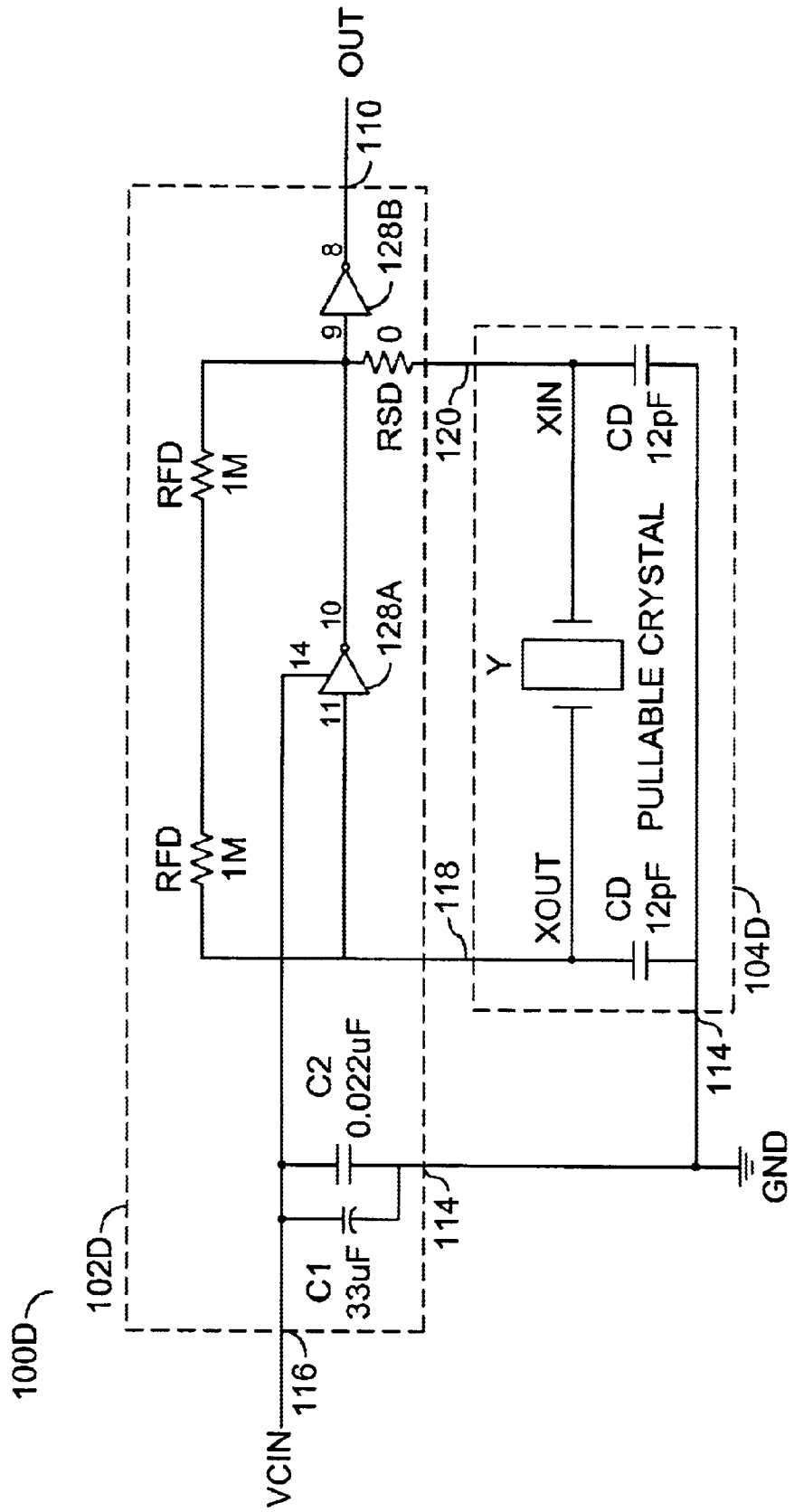
FIG. 8 is a schematic of a fourth example embodiment.

Referring to FIG. 8, a schematic of a fourth example implementation of a VCXO circuit 100D is shown. The fourth VCXO circuit 100D may comprise an inverter circuit 102D and a tank circuit 104D. The inverter circuit 102D generally comprises two inverters 128A–B. The inverters 128A–B may be implemented with a 74HC04 logic device. The first inverter 128A may provide the inverting function required for oscillation. The second inverter 128B may buffer the signal OUT.

Two feedback resistors RFD (two places) may be provided in series between the input and the output of the first inverter 128A. Each of the feedback resistors RFD may have a value 1 MΩ. The two capacitors C1 and C2 may be provided between the interface 116 and the interface 114 to filter the input signal VCIN. A serial resistor RSD between an output of the first inverter 128A and the interface 120. The series resistor RSD may have a value of zero ohms in one embodiment.

The tank circuit 104D may have the same general configuration as the tank circuit 104A. The crystal Y within the tank circuit 104D may be the same crystal as in the tank circuit 104A. Both tank capacitors CD may have a value of 12 pF in the tank circuit 104D.

Figure 9:
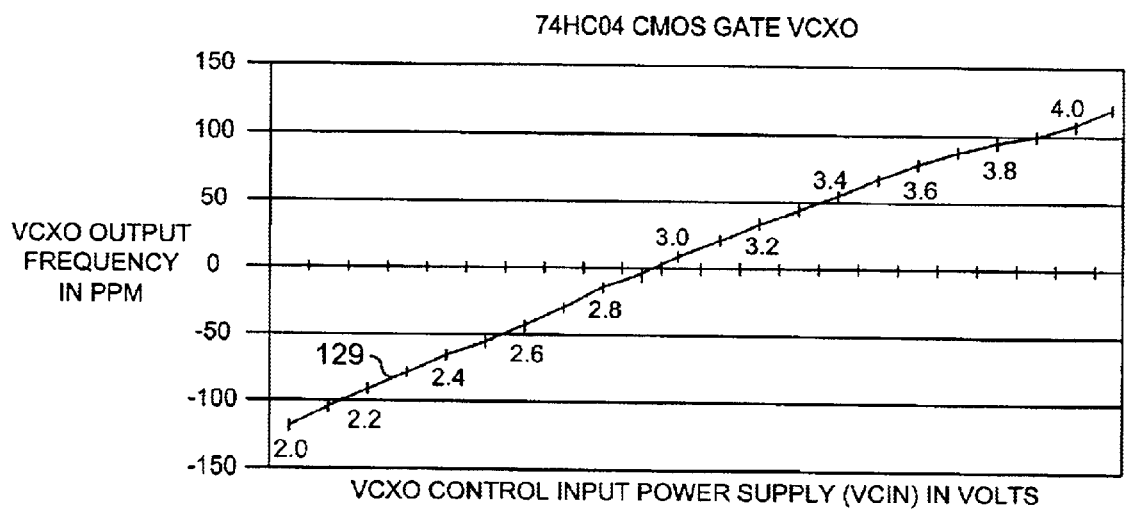
FIG. 9 is a graph of a frequency characteristic of the fourth embodiment.

Referring to FIG. 9, a graph of an output frequency characteristic of the VCXO circuit 100D is shown. The VCXO circuit 100D generally demonstrates an excellent voltage control and frequency pulling ability as shown by a curve 129. A frequency pulling range of the VCXO circuit 100D may extend from −110 ppm to +110 ppm, with a zero ppm control center frequency at approximately 2.9 volts. A linearity of the VCXO circuit 100D generally has characteristics similar to a high end commercial VCXO. With all the un-used input pins tie to the signals VCC or GND, the VCXO circuit 100D working current may be approximately 2.75 milliamperes at zero ppm, including the second inverter 128B. While the signal VCIN is at 3 volts, power consumption for the VCXO circuit 100D may be approximately 8 milliwatts.

Referring to FIGS. 10 and 11, tables of (i) a control gain or sensitivity and (ii) a linearity study for various implementations of the VCXO circuits 100A–D and several conventional VCXOs are shown. Each table generally shows results from multiple copies of each type of VCXO circuit 100A–D. Results from individual conventional VCXOs are provided for comparison purposes. As may be evidenced from the Control Gain Rank column in FIG. 10 and the Absolute Rank column in FIG. 11, the VCXOs fabricated with the CMOS technology of the demodulator device may perform favorably as compared to the VCXOs fabricated with the conventional MK3727 devices and discrete parts.

The above characteristic curves 123, 125, 127 and 129 generally have a positive offset from best-fit straight lines (not shown). The natural positive offset behavior may provide compensation to a PCR loop control behavior. For example, a conventional sigma-delta digital-to-analog converter (DAC) output may usually be used to drive the control signal DAC_OUT. An output characteristic of the sigma-delta DAC, due to unbalance open-drain raising and falling edges, is generally not a straight line.

Figure 12:
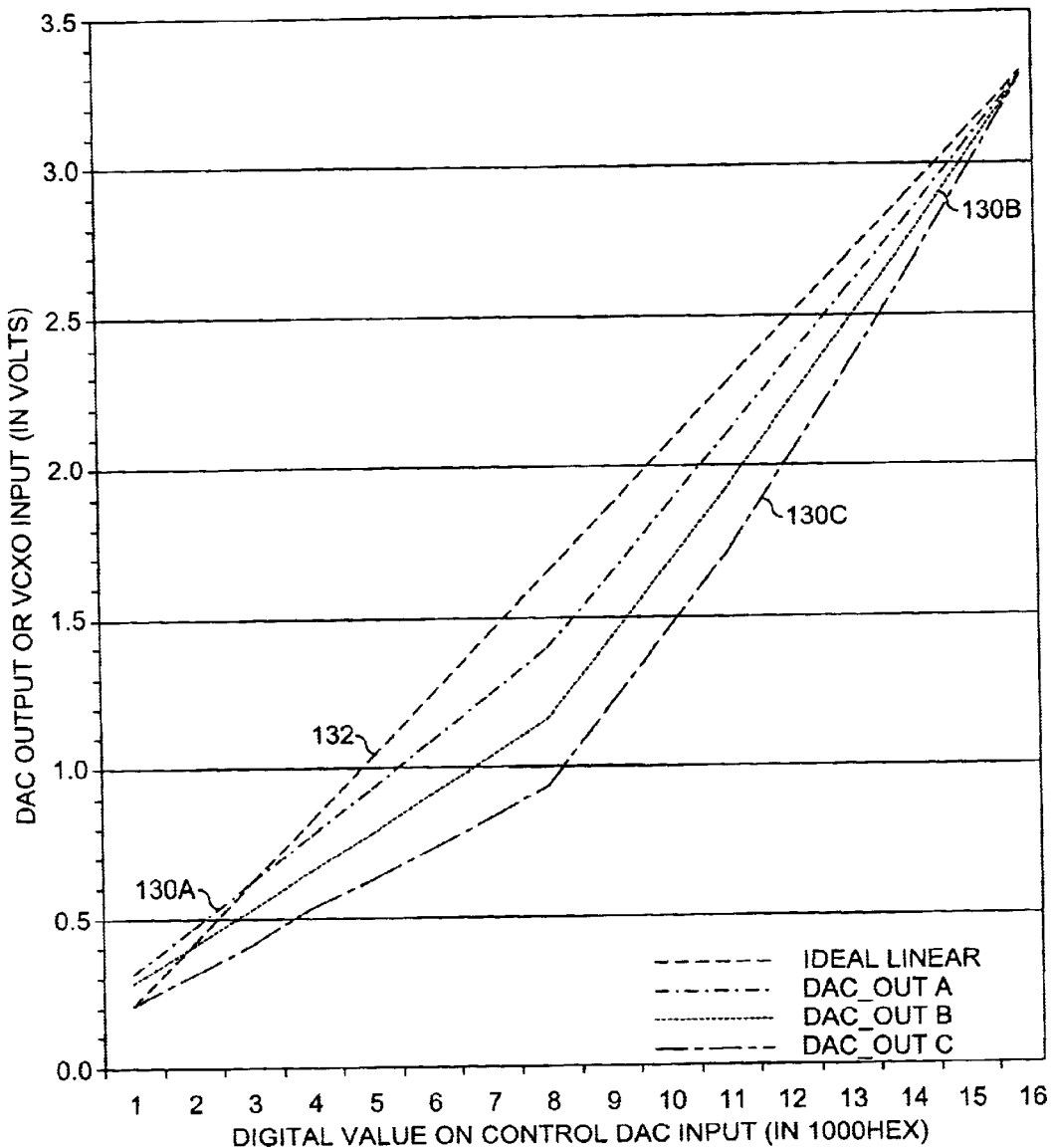
FIG. 12 is a graph of a control signal as a function of a digital value.

Referring to FIG. 12, an output characteristic of several DACs are shown. Plots of a digital value to be converted by the DACs versus signals DAC_OUT A–C generally show output characteristics (e.g., curves 130A–C) that may have a negative offset from an ideal straight line 132, according to hardware design and signal integrity. Therefore, a CMOS gate VCXO circuit 100 with a positive offset (e.g., a curve above line 132) may provide compensation for control performance. As a result, a total control linearity may be very close to a straight line. The Compensated Linearity column in FIG. 11 shows the compensation.

Figure 13:
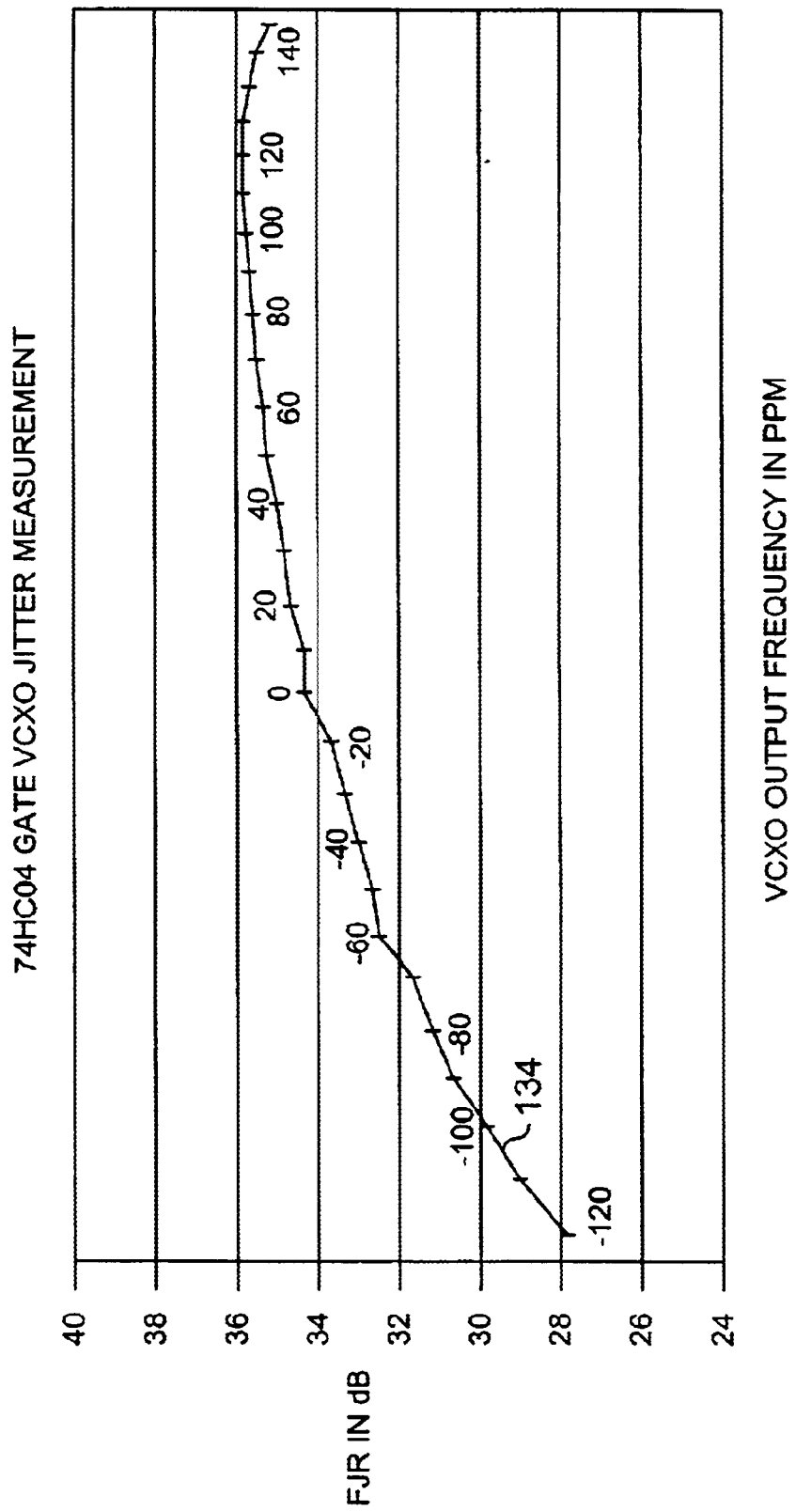
FIG. 13 is a graph of a jitter characteristic of the fourth embodiment.

Referring to FIG. 13, a graph of a jitter measuring result for the VCXO circuit 100D is shown. A Period-to-Jitter Ratio (PJR) may present a relative jitter or phase noise level, similar to a signal-to-noise ratio. A Frequency-to-Frequency Jitter Ratio (FJR) may be used to present the PJR where a period or jitter measurement may be inaccurate.

A curve 134 generally shows that a highest FJR (35.863 dB) may happen at approximately +110 ppm, while a zero ppm FJR may be 34.228 dB. The FJR generally decreases as the control voltage drops. At a −100 ppm point, the FJR may still be an acceptable 29.9 dB.

Jitter or phase noise level for a CMOS gate VCXO circuit 100 may be relatively low due to a small number of possible noise sources. For example, a ground bounce commonly makes disturbances on both power a supply and a control input for conventional VCXO. However, the VCXO circuit 100 may have a single disturbance due to the control signal DAC_OUT. A CMOS gate VCXO circuit 100 without the optional current amplifier/low-pass filter circuit 106 generally has no direct connection to the power signal VCC. Electrical energy required for operating the gate(s) and oscillating may be provided purely from the input signal VCIN. Furthermore, since the input signal may be from inside a PCR feedback loop, the input signal VCIN may be much less susceptible to voltage drift and low-frequency ripple than conventional power supply power that often appears in a system in an open loop format.

For better performance, multiple gates (in odd numbers) may be provided in the inverting circuit 102, and/or a geometry of CMOS field effect transistors within the gates may be modified as to obtain better voltage control sensitivity and linearity. For CMOS gates made with a fast switching technology and/or architecture, a faster speed and smaller delay time through the inverter circuit 102 may cause the VCXO circuit 100 to jump to a 3rd overtone mode, especially when the input signal VCIN reaches a high pulling boundary. Therefore, multiple gates may be used in the inverter circuit 102 to suppress the 3rd overtone mode of the crystal Y and signal XOUT.

Figure 14:
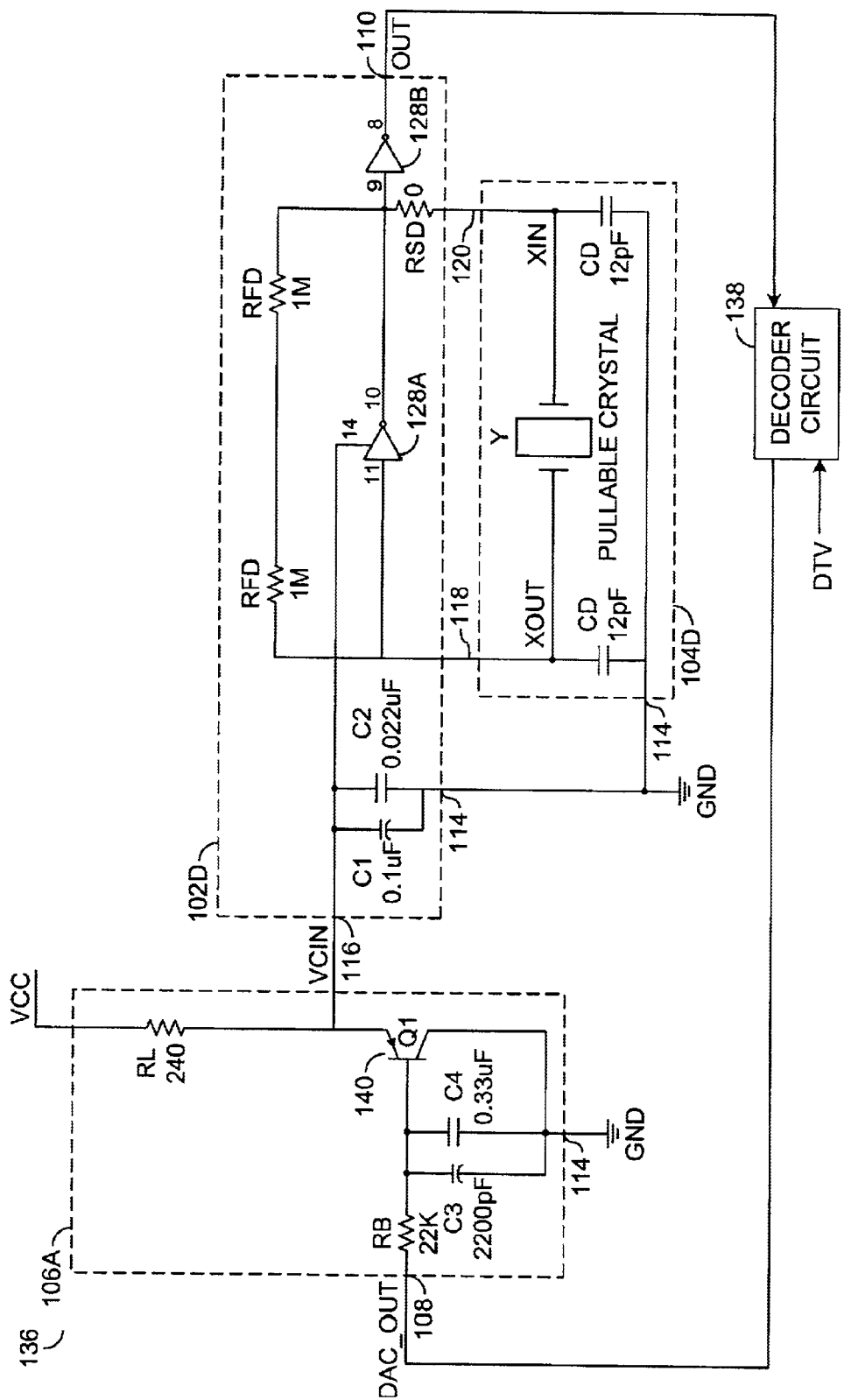
FIG. 14 is a schematic of a first voltage controlled crystal oscillator application (board-level) in a set-top box system.

Referring to FIG. 14, a schematic of a board level implementation of a VCXO in a STB system 136 is shown. The STB system 136 generally comprises the VCXO circuit 100D (FIG. 8), a current amplifier/low-pass filter circuit 106A, a decoder circuit 138 and the 13.5 MHz or 27 MHz pullable crystal Y. The STB system 136 may receive and decode digital television signals (e.g., DTV) from a satellite (not shown).

The decoder circuit 138 may receive the digital television signal DTV and the signal OUT. The decoder circuit 138 may use an internal program clock recovery loop to generate the signal DAC_OUT based upon the signal DTV and the signal OUT. A sigma-delta DAC (now shown) may be provided within the decoder circuit 138 to present the signal DAC_OUT in an analog form.

The current amplifier/low-pass filter circuit 106A generally comprises a transistor 140, a resistor RL, a resistor RB and two capacitors C3 and C4. The transistor 140 may be implemented as a PNP type transistor. Other types of transistors may be implemented to meet the design criteria of a particular application. Other types of current amplifiers, such as operational amplifiers, may be used to meet the design criteria of a particular application.

The transistor 140 may be biased in a common-collector configuration. A collector node of the transistor 140 may be connected to the interface 114. An emitter node of the transistor 140 may be connected one end of the resistor RL and to the interface 116. The other end of the resistor RL may be connected to the interface 112. A base node of the transistor 140 may be connected to one end of the resistor RB. The other end of the resistor RB may be connected to the input 104 to receive the control signal DAC_OUT from the decoder circuit 138. The capacitors C3 and C4 may be connected between the base node and the interface 114. The resistor RB and the capacitors C3 and C4 may implement the low-pass filter that may filter the signal DAC_OUT.

The resistor RL may constantly bias the input signal VCIN toward the power signal VCC. The transistor 140 may constantly pull the input signal VCIN toward the signal GND in response to the control signal DAC_OUT. A base-emitter junction of the transistor 140 may cause the input signal VCIN to be approximately 0.7 volts higher than the control signal DAC_OUT. The current amplifier/low-pass filter circuit 106A may be operative to source a substantial current to the inverter circuit 102D via the input signal VCIN while the current amplifier/low-pass filter circuit 106A simultaneously sinks a relatively smaller current in the control signal DAC_OUT.

Figure 15:
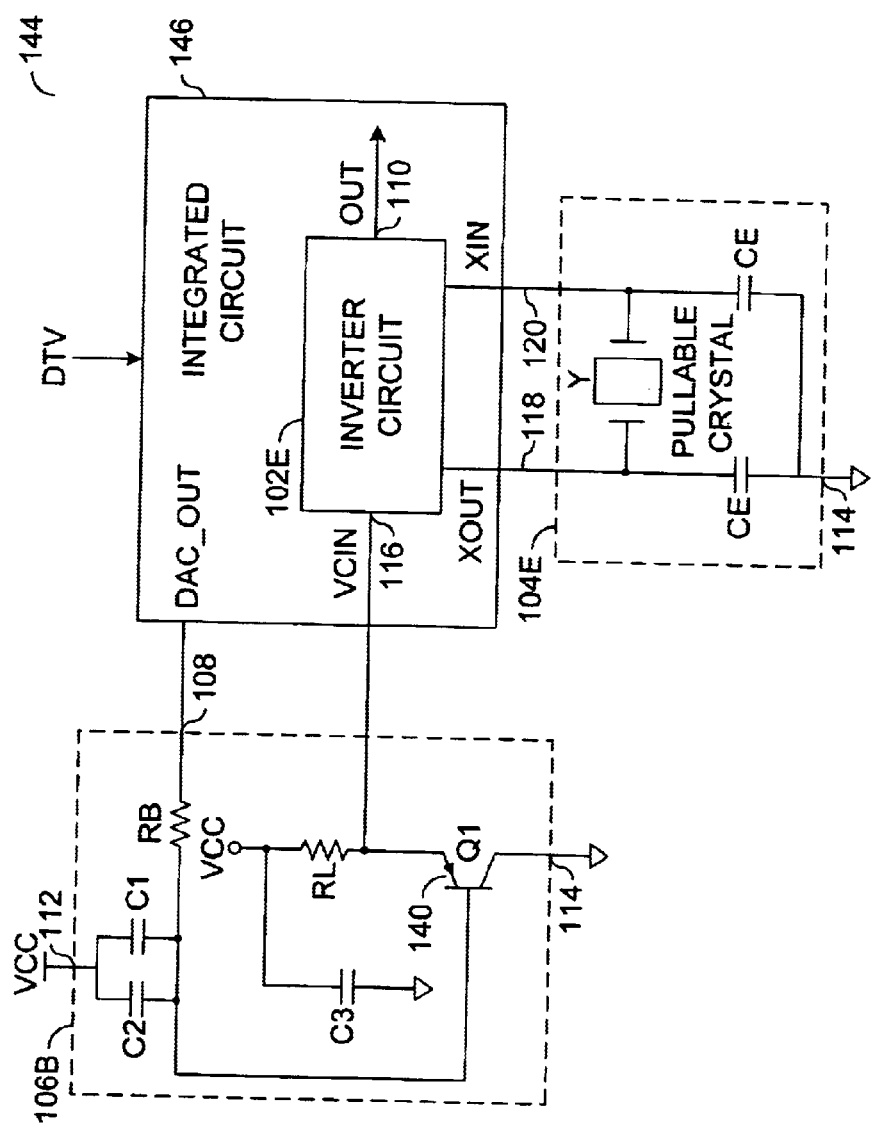
FIG. 15 is a schematic of a second voltage controlled crystal oscillator application (chip-level) in a set-top box system.

Referring to FIG. 15, a schematic of a chip level implementation of a VCXO in a STB system 144 is shown. The STB system 144 generally comprises an integrated circuit 146, a tank circuit 104E, and a current amplifier/low-pass filter circuit 106B. An inverter circuit 102E may be implemented as an integral part of the integrated circuit 146. The integrated circuit 146 may be designed to perform a decoding operation on the digital television signal DTV.

The integrated circuit 146 may be connected to the interface 108 of the current amplifier/low-pass filter circuit 106B to present the control signal DAC_OUT. The inverter circuit 102E, within the integrated circuit 146, may be connected to the current amplifier/low-pass filter circuit 106B to receive the input signal VCIN. The inverter circuit 102E may be connected to the tank circuit 104E to present the signal XIN. The inverter circuit 102E may be connected to the tank circuit 104E to receive the signal XOUT. The signal OUT may be presented by the inverter circuit 102E to other circuits (not shown) within the integrated circuit 146.

The current amplifier/low-pass filter circuit 106B generally comprises the transistor 140, the resistor RL, the resistor RB and three capacitors C1, C2 and C3. The capacitors C1 and C2 may be connected between the base node of the transistor 140 and the interface 112 (e.g., biased to the power signal VCC to achieve a reliable system start-up after power up). The capacitor C3 may be connected between the interface 112 and the interface 114.

Operation of the STB system 144 may be similar to the operation of the STB system 136 (FIG. 14). A Program Clock Recovery (PCR) circuit (not shown) within the integrated circuit 146 may generate the control signal DAC_OUT in response to a master frequency of the digital television signal DTV. The current amplifier/low-pass filter circuit 106B may current amplify the control signal DAC_OUT to generate the input signal VCIN. The inverter circuit 102E and the tank circuit 104E may oscillate proximate or at a center frequency of the crystal Y, offset in frequency due to the variable time delay of the inverter circuit 102E, to track the master frequency.

While the integrated circuit 146 detects that the frequency of the signal OUT is low as compared to the master frequency, the control signal DAC_OUT may be increased. An increase in the control signal DAC_OUT generally results in an increase in the input signal VCIN. An increase in the input signal VCIN may reduce the delay time of the inverter circuit 102E. As a result, the frequency of oscillation for the tank circuit 104E, and thus the frequency of the signal OUT, may increase.

While the integrated circuit 146 detects that the frequency of the signal OUT is high as compared to the master frequency, the control signal DAC_OUT may be decreased. A decrease in the control signal DAC_OUT generally results in a decrease in the input signal VCIN. A decrease in the input signal VCIN may increase the delay time of the inverter circuit 102E. As a result, the frequency of oscillation for the tank circuit 104E, and thus the frequency of the signal OUT may decrease.

A VCXO circuit 100 constructed with CMOS gates may be relatively simple and low cost to implement with a performance sufficient for consumer product applications such as an STB. The frequency pulling range of the VCXO circuit 100 may reach or exceed +/−100 ppm. A jitter or phase noise level of the VCXO circuit 100 may be relatively low as a simple structure contains less possible noise source. A linearity of the VCXO circuit 100 may be close to a straight line and good enough for PCR applications. The VCXO circuit 100 may also compensate for nonlinearity of a sigma-delta DAC output. As a result, the performance to cost ratio may be high among other conventional VCXOs. The VCXO circuit 100 may be implemented at both a chip level and a board level, with smaller supporting bill of materials. Chip level implementation generally results in a small circuit area and low power consumption. Board level implementation generally results in a BOM cost of less than 50 cents, which may be low among conventional VCXOs.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a tank circuit configured to generate a first signal having a frequency of oscillation in response to a second signal;
   an inverter circuit configured to (i) generate said second signal in response to inverting said first signal and (ii) adjust a delay in generating said second signal in response to an input signal to change said frequency of oscillation; and
   a current amplifier configured to generate said input signal in response to a control signal, said current amplifier comprising a transistor biased in a common-collector configuration to pull said input signal toward a return of a power supply voltage.

2. The circuit according to claim 1, wherein said tank circuit comprises a pullable crystal having a pulling range about a predetermined frequency.

3. The circuit according to claim 2, wherein said inverter circuit is further configured to suppress a third overtone mode in said first signal.

4. The circuit according to claim 1, wherein said current amplifier further comprises:
   a resistor configured to bias said input signal toward said power supply voltage.

5. The circuit according to claim 1, wherein said frequency of oscillation has a positive transfer function in response to said input signal.

6. The circuit according to claim 5, wherein said inverter circuit is further configured to decrease a rate of change for said frequency of oscillation as said input signal increases.

7. The circuit according to claim 1, wherein said inverter circuit generates said second signal from electrical power received from said input signal.

8. The circuit according to claim 1, wherein (i) said inverter circuit is disposed within an integrated circuit configured to decode a digital television signal and (ii) said tank circuit is disposed external to said integrated circuit.

9. The circuit according to claim 1, wherein said inverter circuit comprises a digital logic gate configured to generate said second signal.

10. A method of controlling a frequency of oscillation, comprising the steps of:
    (A) generating a first signal having said frequency of oscillation in response to a second signal;
    (B) generating said second signal in response to inverting said first signal;
    (C) adjusting a delay in generating said second signal in response to an input signal to change said frequency of oscillation; and
    (D) generating said input signal by current amplifying a control signal, said current amplifying being biased in a common-collector configuration and pulling said input signal toward a return of a power supply voltage.

11. The method according to claim 10, wherein said first signal is adjustable over a pulling range about a predetermined frequency.

12. The method according to claim 11, further comprising the step of suppressing a third overtone mode in said first signal as part of generating said second signal.

13. The method according to claim 10 wherein the step of generating said input signal further comprises the sub-step of:
    biasing said input signal toward said power supply voltage.

14. The method according to claim 10, wherein said frequency of oscillation has a positive transfer function in response to said input signal.

15. The method according to claim 14, further comprising the step of decreasing a rate of change for said frequency of oscillation as said input signal increases.

16. The method according to claim 10, wherein step (B) further comprises the sub-step of generating said second signal from electrical power received from said input signal.

17. The circuit according to claim 10, wherein said inverter circuit comprises a plurality of inverters connected in series to generate said second signal.

18. The method according to claim 10, further comprising the step of:
    generating said control signal by conversion from a digital to an analog form.

19. The method according to claim 10, further comprising the step of:
    generating said control signal in response to said frequency of oscillation and a digital television signal.

20. A circuit comprising:
    means for generating a first signal having said frequency of oscillation in response to a second signal;
    means for generating said second signal in response to inverting said first signal;
    means for adjusting a delay in generating said second signal in response to an input signal to change said frequency of oscillation; and
    means for generating said input signal by current amplifying a control signal, said current amplifying being biased in a common-collector configuration and pulling said input signal toward a return of a power supply voltage.

* * * * *